(12) United States Patent
Lin

(10) Patent No.: US 9,748,055 B2
(45) Date of Patent: Aug. 29, 2017

(54) OUTPUT-SWITCH CONTROL SYSTEM FOR AC-DC POWER SUPPLY

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 230 days.

(21) Appl. No.: 14/656,092

(22) Filed: Mar. 12, 2015

(65) Prior Publication Data
US 2016/0268072 A1    Sep. 15, 2016

(51) Int. Cl.
*H01H 31/10* (2006.01)
*H01H 33/52* (2006.01)
*H01H 33/59* (2006.01)
*H01H 47/00* (2006.01)
*H01H 85/46* (2006.01)
*H01H 19/14* (2006.01)
*H01H 9/54* (2006.01)
*H01H 13/14* (2006.01)
*H01H 13/52* (2006.01)

(52) U.S. Cl.
CPC .............. *H01H 9/547* (2013.01); *H01H 9/54* (2013.01); *H01H 13/14* (2013.01); *H01H 2013/525* (2013.01); *H01H 2235/004* (2013.01)

(58) Field of Classification Search
CPC ........ H01H 47/00; H01H 47/002; H01H 9/54; H01H 33/596; H01H 9/56; H01H 11/00; H01H 13/14; H01H 13/705; H01H 1/403; H01H 2009/546; H01H 2050/049; H01H 21/22; H01H 21/60; H01H 2221/024
See application file for complete search history.

(56) References Cited

U.S. PATENT DOCUMENTS

| | | | | |
|---|---|---|---|---|
| 5,517,396 A | * | 5/1996 | Murata | H02M 7/003 361/79 |
| 5,646,382 A | * | 7/1997 | Moriya | H01H 13/72 200/5 E |
| 5,907,138 A | * | 5/1999 | Metzler | H01H 13/64 200/1 B |
| 5,932,854 A | * | 8/1999 | Umemura | H01H 13/72 200/5 B |
| 5,994,652 A | * | 11/1999 | Umemura | H01H 9/0066 200/5 B |

(Continued)

*Primary Examiner* — Carlos Amaya
*Assistant Examiner* — Esayas Yeshaw
(74) *Attorney, Agent, or Firm* — Ming Chow; Sinorica, LLC

(57) ABSTRACT

An output-switch control system for an AC-DC power supply includes a push-button switch that has two triggers. The triggers correspond to different contacts of a detecting circuit, respectively. When the push-button switch is pressed to make the triggers and the contacts turn into a close-circuit state form an open-circuit state, the detecting circuit outputs a power-source-on signal, and when the push-button switch is pressed again, and either of the triggers and the contact turn into the close-circuit state form the open-circuit state, the detecting circuit outputs a power-source-off signal immediately. With the dual-transition signal certification at the contacts, safe output-switch control can be achieved, so as to provide a user with operational safety.

5 Claims, 5 Drawing Sheets

(56) References Cited

U.S. PATENT DOCUMENTS

| | | | | |
|---|---|---|---|---|
| 6,015,959 | A * | 1/2000 | Slepian | H01H 3/3015 200/400 |
| 6,303,884 | B1 * | 10/2001 | Hou | H01H 21/26 200/343 |
| 6,456,041 | B1 * | 9/2002 | Terada | B60L 11/1861 320/132 |
| 2001/0054884 | A1 * | 12/2001 | Azuma | G06F 1/3206 323/282 |
| 2009/0301850 | A1 * | 12/2009 | Puhalla | H01H 71/128 200/321 |
| 2011/0141776 | A1 * | 6/2011 | Lin | H02H 7/125 363/53 |
| 2013/0195498 | A1 * | 8/2013 | Kusumi | G03G 15/5004 399/88 |
| 2015/0318688 | A1 * | 11/2015 | Ai | H02H 9/02 361/87 |

* cited by examiner

OUTPUT-SWITCH CONTROL SYSTEM FOR AC-DC POWER SUPPLY

BACKGROUND OF THE INVENTION

1. Technical Field

The present invention relates to control systems for power supplies, and more particularly to an output-switch control system for an AC-DC power supply that ensure users' operational safety.

2. Description of Related Art

Referring to FIG. 1, a conventional output-switch control system for a power supply comprises a first contact switch 1 and a second contact switch 2. The first contact switch 1 is a contact switch in an open-circuit state, and the second contact switch 2 is a contact switch in a close-circuit state. In use, the first and second contact switches 1, 2 jointly send voltage signals to a detecting circuit 7 through reference voltages 3, 4 and shunt resistors 5, 6, respectively. The detecting circuit 7 has an input pin connected to the loop of the second contact switch 2, and another input pin connected to the loop of the first contact switch 1. Thereby, the system uses the voltage signals of the first and second contact switches 1, 2 to control the detecting circuit 7 to make a high-voltage switch 8 turn on its high-voltage output.

Now referring to FIG. 2, when a user presses a switch button 9 of the control system, the first contact switch 1 has its movable contact 101 coming to contact with a fixed contact 102, and thereby turns into a close-circuit state, while the second contact switch 2 has its movable contact 201 departing from the fixed contact 202, and thereby turns into an open-circuit state. Upon the foregoing state transition of the first contact switch 1 and the second contact switch 2, transition signals are sent to the detecting circuit 7 through the reference voltages 3, 4. Thereby, the system can control the detecting circuit 7 using the voltage signals of the first and second contact switches 1, 2, so as to make the detecting circuit 7 turn on the high-voltage output.

While the existing output-switch control system turns the switch on or off using the first and second contact switches 1, 2 separately, once either of the contacts has poor contact or becomes fatigued, the output-switch control system can fail to properly turn on or off the high voltage high-voltage switch 8, risking its user to electric shocks. Hence, there is a need for switch control in power supplies that ensures users' safety.

SUMMARY OF THE INVENTION

The objective of the present invention is to provide an output-switch control system for an AC-DC power supply, wherein the output-switch control system uses dual-transition signal certification to achieve safe control of an output switch, thereby ensuring users' operational safety.

For accomplishing the foregoing objective, the disclosed output-switch control system comprises: a push-button switch, having a lengthwise button that includes at least two triggers and at least one spring member, so that the lengthwise button forms a self-return button; and a detecting circuit having an input end provided with at least two contacts that correspond to the triggers, respectively, wherein the contacts and the triggers initially form an open-circuit state.

In use of the disclosed output-switch control system, when the push-button switch is pressed so that the triggers and the contacts both turn from the open-circuit state into the close-circuit state, the detecting circuit outputs a power-source-on signal, and when the push-button switch is pressed again, and either of the trigger and the contact turn from the open-circuit state into the close-circuit state, the detecting circuit immediately outputs a power-source-off signal. With the dual-transition signal certification at the contacts, safe output-switch control can be achieved, so as to provide a user with operational safety.

DETAILED DESCRIPTION OF THE INVENTION

Figure 1:
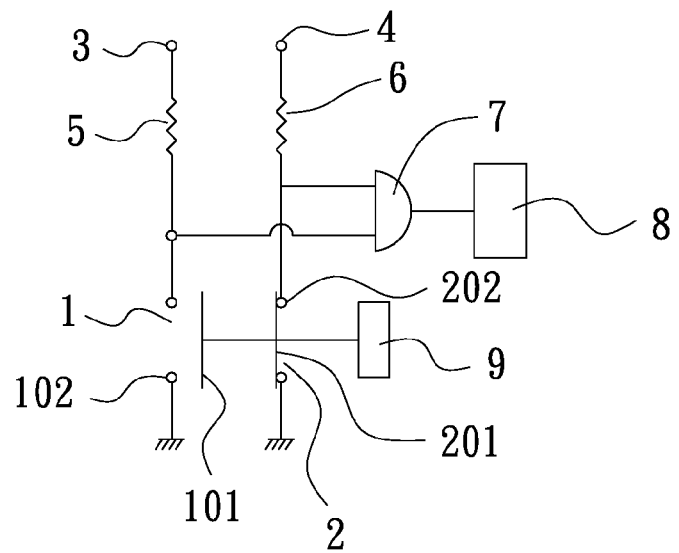
FIG. 1 is a schematic diagram of a conventional output-switch control system for a power supply, showing a START loop contact switch.
Figure 2:
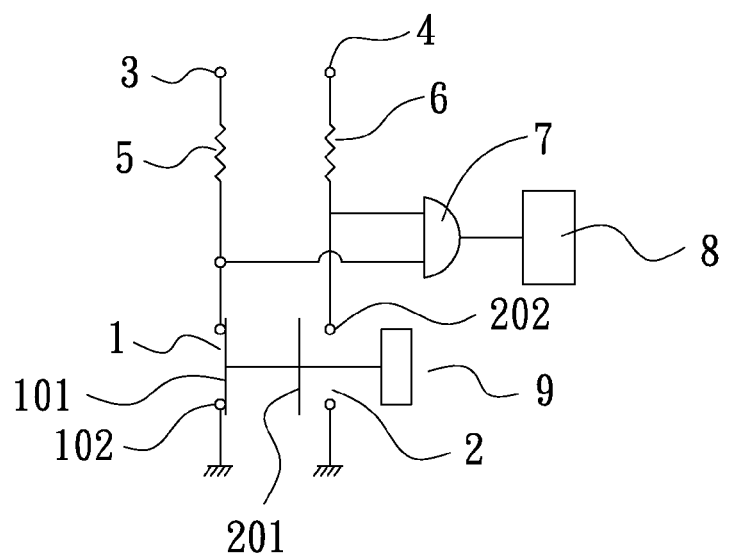
FIG. 2 is a schematic diagram of the conventional output-switch control system, showing a STOP loop contact switch.
Figure 3:
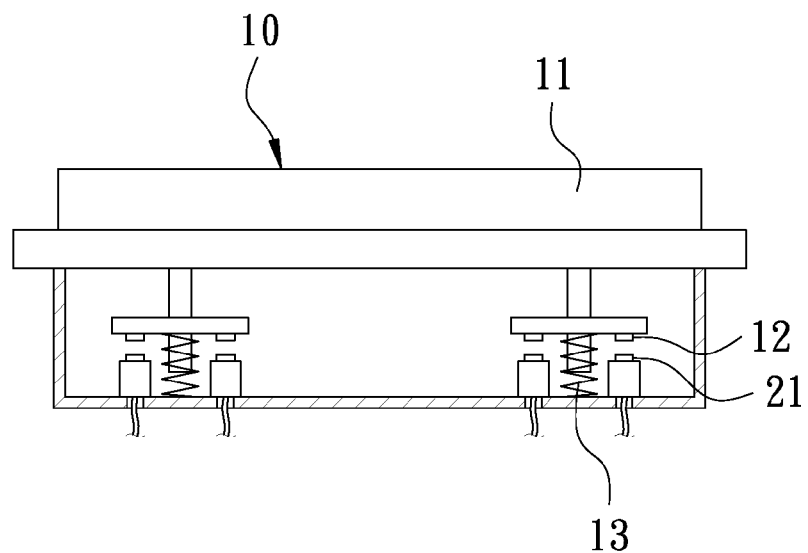
FIG. 3 graphically illustrates a push-button switch of the present invention, showing a first contact switch.
Figure 4:
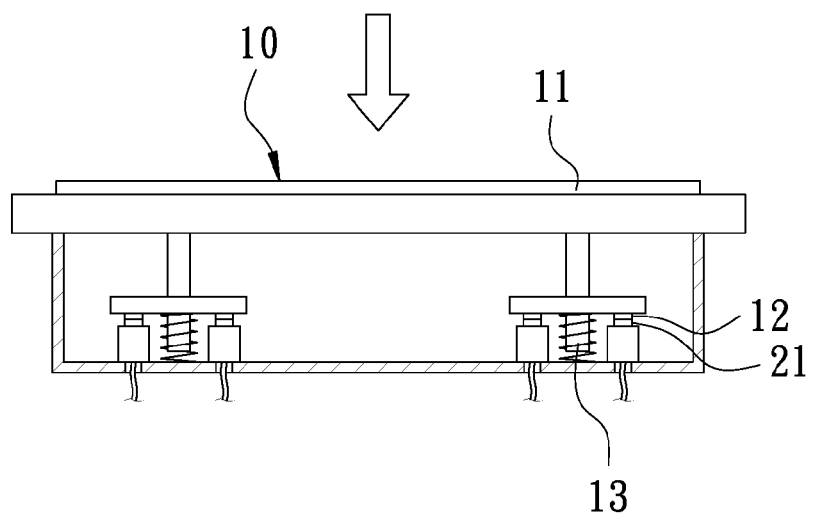
FIG. 4 graphically illustrates the present invention, showing a second contact switch.
Figure 5:
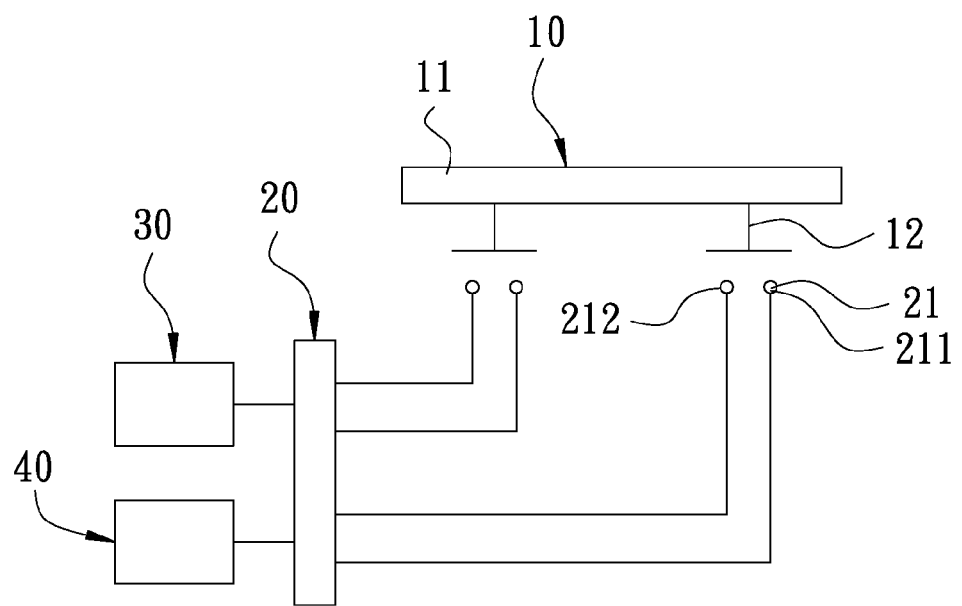
FIG. 5 is a wiring diagram of the present invention, showing the first contact switch.
Figure 6:
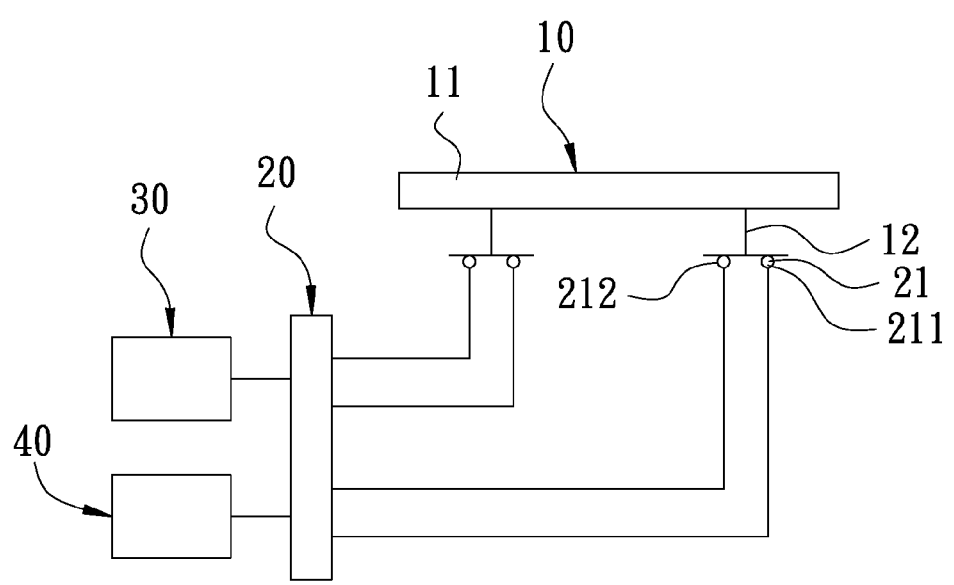
FIG. 6 is a wiring diagram of the present invention, showing the second contact switch.

Referring to FIG. 3 and FIG. 5, which are a schematic diagram of a push-button switch and a wiring diagram of the present invention, an output-switch control system for an AC-DC power supply is shown. The output-switch control system comprises a push-button switch 10, a detecting circuit 20, a CPU30, and a high-capacity power switch 40.

The push-button switch 10 has a lengthwise button 11. Below the lengthwise button 11 there are two separated triggers 12. The lengthwise button 11 has two spring members 13 each corresponding to one said triggers 12, so that the lengthwise button 11 after pressed can be returned to its initial position by the spring members 13, thereby forming a self-return button.

The detecting circuit 20 has an input end provided with two contacts 21. The contacts 21 each form an independent loop. The contacts 21 correspond to the triggers 12, and the contacts 21 and the triggers 12 initially form an open-circuit state. The lengthwise button 11 can drive the triggers 12 to downward abut against the contacts 21 so as to form the close-circuit state. In the present invention, each of the contacts 21 has two free ends 211, 212 corresponding to the trigger 12. The free ends 211, 212 correspond to two ends of the triggers 12, respectively, and the free ends 211, 212 are connected to the detecting circuit 20. The trigger 12 can selectively work with the free ends 211, 212 to form the first contact of the open-circuit state or the second contact of the close-circuit state.

The CPU30 is electrically connected to the detecting circuit 20.

The high-capacity power switch 40 is electrically connected to the detecting circuit 20, and may be a contactless switch.

Figure 8:
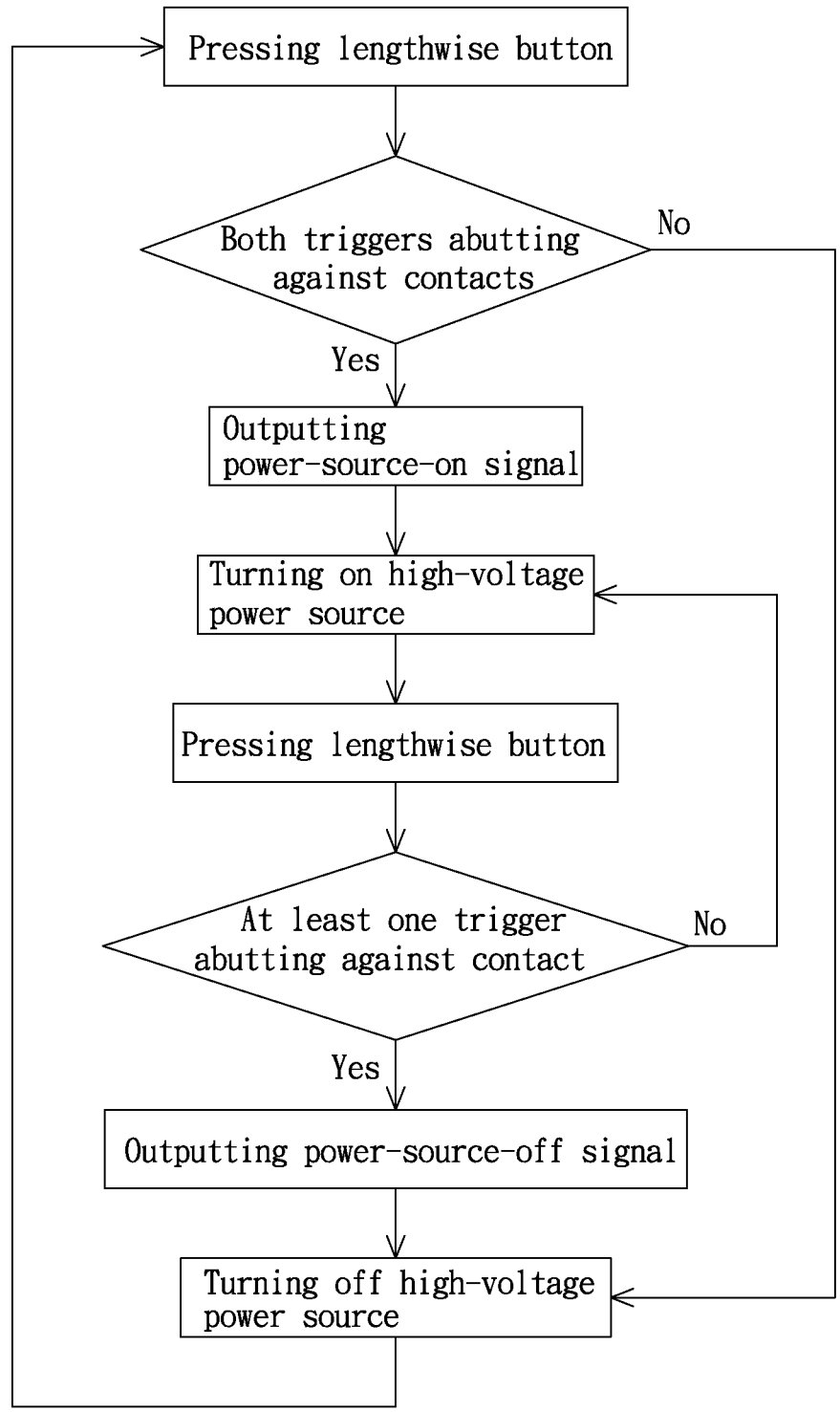
FIG. 8 is a flowchart of the present invention.

Referring now to FIG. 3 through FIG. 6, as well as FIG. 8, the triggers 12 and the contacts 21 initially form the first contact of the open-circuit state. In use, a user presses the lengthwise button 11 to make the triggers 12 downward abut against the free ends 211, 212 of the contacts 21, so that the trigger 12 and the free ends 211, 212 form the second contact of the close-circuit state. When the trigger 12 and the contacts 21 turn into the second contact of the close-circuit state, the detecting circuit 20 receives voltage signals from both of the contacts 21. At this time, the detecting circuit 20 outputs a power-source-on signal to control the high-capacity power switch 40 turn on a high-voltage power source. Since the lengthwise button 11 is a self-return button, after the user presses the lengthwise button 11 to make the trigger 12 and the contacts 21 turn into the second contact of the close-circuit state, the lengthwise button 11 returns to the first contact of the open-circuit state, and stops sending voltage signals from the contacts 21 to the detecting circuit 20. When the user presses the lengthwise button 11 again to make the trigger 12 and the contacts 21 turn into the second contact of the close-circuit state, the detecting circuit 20 again receives the voltage signals from the both contacts 21. At this time, the detecting circuit 20 outputs a power-source-off signal that make the high-capacity power switch 40 turn off the high-voltage power source. With the dual-transition signal certification at the contacts 21, safe output-switch control can be achieved, so as to provide a user with operational safety.

Figure 7:
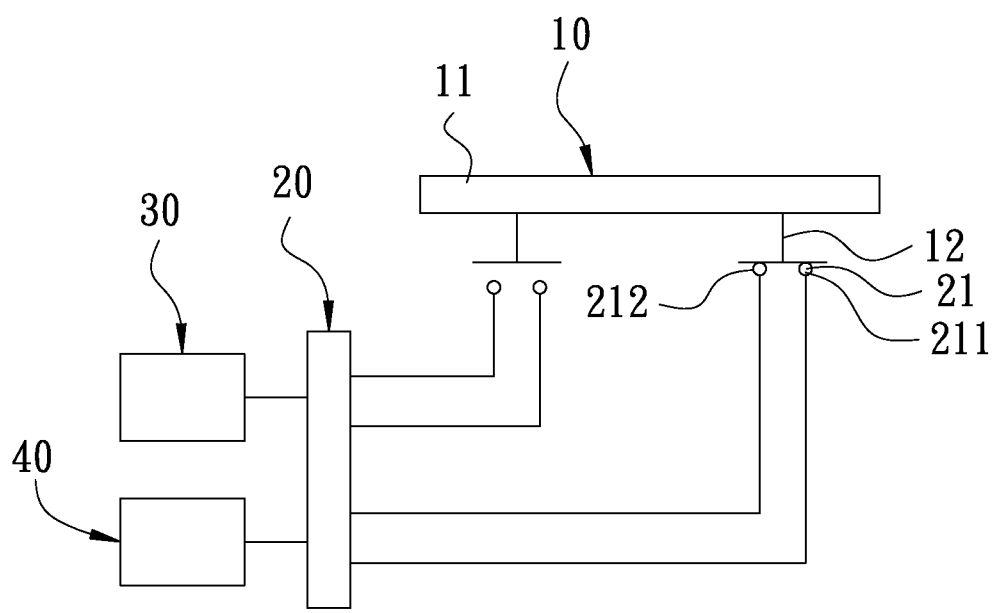
FIG. 7 is a wiring diagram of the present invention, showing a single contact switch contacting for state transition.

Referring now to FIG. 7, as well as FIG. 8, when a user presses the lengthwise button 11 to make only one said trigger 12 and the contact 21 turn into the second contact of the close-circuit state, the detecting circuit 20 can only receive the voltage signal from the second contact. At this time, the detecting circuit 20 does not output any power-source-on signal. Instead, it immediately outputs a power-source-off signal to make the high-capacity power switch 40 turn off the high-voltage power source. Thereby, as long as any of the triggers 12 fails to work with the contact 21 normally, the output-switch control system can no longer control the high-capacity power switch 40 to selectively turn on the high-voltage power source, but can only control the high-capacity power switch 40 to turn off the high-voltage power source. In this way, the output-switch control system can achieve safer output-switch control, thereby ensuring users' operational safety.

The features and effects of the present invention are restated as below.

In the disclosed output-switch control system, when the trigger 12 and the contacts 21 form the second contact of the close-circuit state, the detecting circuit 20 controls the high-capacity power switch 40 to turn on the high-voltage power source. When there is only one trigger 12 forming with the contact 21 into the second contact of the close-circuit state, the detecting circuit 20 immediately controls the high-capacity power switch 40 to turn off the high-voltage power source. With the dual-transition signal certification at the contacts 21, safe output-switch control can be achieved, so as to provide a user with operational safety.

What is claimed is:

1. An output-switch control system for an AC-DC power supply, the output-switch control system comprising:
   a push-button switch;
   the push-button switch comprising a lengthwise button, a first trigger, a second trigger, a first spring member and a second spring member;
   the first trigger and the second trigger being connected to the lengthwise button;
   the first spring member being biased against the first trigger;
   the second spring member being biased against the second trigger;
   the lengthwise button being configured as a self-return button via the first spring member and the second spring member;
   a detecting circuit;
   the detecting circuit comprising a first contact and a second contact;
   the first contact and the first trigger corresponding to each other;
   the second contact and the second trigger corresponding to each other;
   the first trigger being capable of separating from the first contact through the first spring member being biased against the first trigger;
   the second trigger being capable of separating from the second contact through the second spring member being biased against the second trigger;
   the first trigger being capable of abutting against the first contact through the lengthwise button being pressed;
   the second trigger being capable of abutting against the second contact through the lengthwise button being pressed;
   the detecting circuit outputting a power-source-on signal in response to the first trigger abutting against the first contact and the second trigger abutting against the second contact at a first time, and thereafter outputting a power-source-off signal after outputting the power-source-on signal in response to the first trigger abutting against the first contact and the second trigger abutting against the second contact at a second time after the first time; and
   the detecting circuit outputting the power-source-off signal without outputting the power-source-on signal in response to the first trigger abutting against the first contact and the second trigger separating from the second contact, or in response to the first trigger separating from the first contact and the second trigger abutting against the second contact.

2. The output-switch control system of claim 1 comprising:
   each of the first contact and the second contact comprising two free ends;
   the two free ends being connected to the detecting circuit;
   the two free ends of the first contact corresponding to the first trigger;
   the first trigger being capable of separating from the two free ends of the first contact through the first spring member being biased against the first trigger;
   the first trigger being capable of abutting against the two free ends of the first contact through the lengthwise button being pressed;
   the two free ends of the second contact corresponding to the second trigger;
   the second trigger being capable of separating from the two free ends of the second contact through the second spring member being biased against the second trigger; and
   the second trigger being capable of abutting against the two free ends of the second contact through the lengthwise button being pressed.

3. The output-switch control system of claim 1 comprising:
   a CPU;
   the CPU being electrically connected to the detecting circuit.

4. The output-switch control system of claim 1 comprising:
   a high-capacity power switch;

the high-capacity power switch being electrically connected to the detecting circuit;

the high-capacity power switch being configured to turn on a high-voltage power source in response to the detecting circuit outputting the power-source-on signal; and the high-capacity power switch being configured to turn off the high-voltage power source in response to the detecting circuit outputting the power-source-off signal.

5. The output-switch control system of claim 4 comprising:

the high-capacity power switch being a contactless switch.

* * * * *